US012143741B2

(12) United States Patent
Uesugi et al.

(10) Patent No.: US 12,143,741 B2
(45) Date of Patent: Nov. 12, 2024

(54) SOLID-STATE IMAGING DEVICE, AND ELECTRONIC APPARATUS

(71) Applicant: SONY SEMICONDUCTOR SOLUTIONS CORPORATION, Kanagawa (JP)

(72) Inventors: Yuji Uesugi, Kanagawa (JP); Fumihiko Koga, Kanagawa (JP); Keisuke Hatano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/357,512

(22) Filed: Jul. 24, 2023

(65) Prior Publication Data

US 2023/0370742 A1   Nov. 16, 2023

Related U.S. Application Data

(63) Continuation of application No. 17/656,584, filed on Mar. 25, 2022, now Pat. No. 11,765,483, which is a
(Continued)

(30) Foreign Application Priority Data

Apr. 11, 2017  (JP) ................................ 2017-078182

(51) Int. Cl.
*H04N 25/76* (2023.01)
*H01L 27/146* (2006.01)

(52) U.S. Cl.
CPC ....... *H04N 25/76* (2023.01); *H01L 27/14643* (2013.01)

(58) Field of Classification Search
CPC .. H04N 25/76; H04N 25/70; H01L 27/14643; H01L 27/14603; H01L 27/146; H01L 27/14609
See application file for complete search history.

(56) References Cited

U.S. PATENT DOCUMENTS 4,274,056 A * 6/1981 Lukes ................. H03F 3/45475
330/9
6,233,012 B1   5/2001 Guerrieri et al.
(Continued)

FOREIGN PATENT DOCUMENTS

EP   0915518 A2   5/1999
JP   06-350925 A   12/1994
(Continued)

OTHER PUBLICATIONS

International Search Report and Written Opinion of PCT Application No. PCT/JP2018/012713, issued on Jun. 19, 2018, 08 pages of ISRWO.
(Continued)

*Primary Examiner* — Hung H Lam
(74) *Attorney, Agent, or Firm* — CHIP LAW GROUP

(57) ABSTRACT

Provided is a light detecting device, including a first electrode and a third electrode formed on a semiconductor layer, a photoelectric conversion layer formed on the first electrode and the third electrode, a second electrode formed on the photoelectric conversion layer, and an insulation film is disposed between the third electrode and the photoelectric conversion layer. A voltage of the third electrode is controlled to a voltage corresponding to a detection result which can contribute to control of discharge of charges or assist for transfer of charges.

18 Claims, 25 Drawing Sheets

Related U.S. Application Data continuation of application No. 16/491,377, filed as application No. PCT/JP2018/012713 on Mar. 28, 2018, now Pat. No. 11,310,452.

(56) References Cited

U.S. PATENT DOCUMENTS

| | | |
|---|---|---|
| 2007/0097240 A1 | 5/2007 | Egawa |
| 2008/0258047 A1* | 10/2008 | Sakakibara .......... H04N 25/616 |
| | | 250/214 C |
| 2012/0314117 A1 | 12/2012 | Irie |
| 2014/0117486 A1 | 5/2014 | Doi |
| 2016/0119562 A1* | 4/2016 | Takase .............. H01L 27/14612 |
| | | 348/312 |
| 2017/0162617 A1 | 6/2017 | Takahashi et al. |
| 2019/0214417 A1 | 7/2019 | Matsuo |
| 2019/0279544 A1* | 9/2019 | Shin ...................... G02F 1/1368 |
| 2020/0249363 A1* | 8/2020 | Cao ......................... G01T 1/244 |

FOREIGN PATENT DOCUMENTS

| | | |
|---|---|---|
| JP | 11-238867 A | 8/1999 |
| JP | 2016-086407 A | 5/2016 |
| JP | 2017-055085 A | 3/2017 |
| WO | 2013/001809 A1 | 1/2013 |

OTHER PUBLICATIONS

Non-Final Office Action issued in U.S. Appl. No. 16/491,377 on Apr. 16, 2021.
Final Office Action issued in U.S. Appl. No. 16/491,377 on Oct. 1, 2021.
Notice of Allowance issued in U.S. Appl. No. 16/491,377 on Dec. 1, 2021.
Non-Final Office Action issued in U.S. Appl. No. 17/656,584 on Nov. 17, 2022.
Notice of Allowance issued in U.S. Appl. No. 17/656,584 on Apr. 4, 2023.

* cited by examiner

FIG. 13D   IMAGE OUTPUT AFTER CDS

FIG. 23

| FACTOR | | V1 RATE OF LOWER ELECTRODE | V2 RATE OF SHIELD ELECTRODE | PURPOSE |
|---|---|---|---|---|
| GAIN | HIGH | LOW | SET TO HIGH | ASSIST FOR CHARGE AMOUNT |
| | LOW | HIGH | SET TO LOW | CHARGE DISCHARGE |
| TEMPERATURE | HIGH | — | SET TO LOW | CHARGE DISCHARGE |
| | LOW | — | SET TO HIGH | ASSIST FOR CHARGE AMOUNT |
| LIGHT AMOUNT | LARGE AMOUNT | HIGH | SET TO LOW | CHARGE DISCHARGE |
| | SMALL AMOUNT | LOW | SET TO HIGH | ASSIST FOR CHARGE AMOUNT |

SOLID-STATE IMAGING DEVICE, AND ELECTRONIC APPARATUS

CROSS REFERENCE TO RELATED APPLICATIONS

This Patent Application makes reference to, claims priority to, claims the benefit of, and is a Continuation Application of U.S. patent application Ser. No. 17/656,784, filed Mar. 25, 2022; which is a Continuation Application of U.S. patent application Ser. No. 16/491,377, filed Sep. 5, 2019, now U.S. Pat. No. 11,310,452; which is a U.S. National Phase of International Patent Application No. PCT/JP2018/012713 filed on Mar. 28, 2018, which claims priority benefit of Japanese Patent Application No. JP 2017-078182 filed in the Japan Patent Office on Apr. 11, 2017. Each of the above-referenced applications is hereby incorporated herein by reference in its entirety.

TECHNICAL FIELD

The present technology relates to a solid-state imaging device and an electronic apparatus, particularly to a solid-state imaging device and an electronic apparatus with which pixel property can be improved.

BACKGROUND ART

In relation to a solid-state imaging device such as a CMOS (Complementary Metal Oxide Semiconductor) image sensor, there is a technology disclosed by which a shield electrode is disposed for separation between lower electrodes of a pixel (see PTL 1, for example).

In the solid-state imaging device, disposing a shield electrode makes it possible to prevent coupling between pixels, improve a readout speed of electric charges by applying a lateral electric field, and discharge unnecessary charges which have not been read out.

CITATION LIST

Patent Literature

[PTL 1]
PCT Patent Publication No. WO2013/001809

SUMMARY

Technical Problem

Incidentally, an inadequate voltage difference between a lower electrode and a shield electrode deteriorates a pixel property in some cases, and a technology for suppressing such a deterioration of the pixel property is required.

The present technology is made in view of such a situation, and makes it possible to improve the pixel property.

Solution to Problem

The solid-state imaging device according to a first aspect of the present technology is a solid-state imaging device including a first electrode formed on a semiconductor layer, a photoelectric conversion layer formed on the first electrode, a second electrode formed on the photoelectric conversion layer, and a third electrode disposed between the first electrode and an adjacent first electrode, and electrically insulated. A voltage of the third electrode is controlled to a voltage corresponding to a detection result which can contribute to control of discharge of charges or assist for transfer of charges.

In the solid-state imaging device according to the first aspect of the present technology, the voltage of the third electrode disposed between the adjacent first electrodes formed on the semiconductor layer and electrically insulated is controlled to a voltage corresponding to a detection result which can contribute to control of discharge of charges or assist for transfer of charges.

The electronic apparatus according to a second aspect of the present technology is an electronic apparatus mounted with a solid-state imaging device, the solid-state imaging device including a first electrode formed on a semiconductor layer, a photoelectric conversion layer formed on the first electrode, a second electrode formed on the photoelectric conversion layer, and a third electrode disposed between the first electrode and an adjacent first electrode, and electrically insulated. A voltage of the third electrode is controlled to a voltage corresponding to a detection result which can contribute to control of discharge of charges or assist for transfer of charges.

In the electronic apparatus according to the second aspect of the present technology, the voltage of the third electrode disposed between the adjacent first electrodes formed on the semiconductor layer and electrically insulated is controlled to a voltage corresponding to a detection result which can contribute to control of discharge of charges or assist for transfer of charges.

The solid-state imaging device according to the first aspect of the present technology or the electronic apparatus according to the second aspect of the present technology may be an independent device or an internal block constituting one device.

Advantageous Effect of Invention

According to the first and second aspects of the present technology, the pixel property can be improved.

Note that the effect described herein is not necessarily limited, and may be any effect described in the present disclosure.

BRIEF DESCRIPTION OF DRAWINGS

FIGS. 13A, 13B, 13C, and 13D are diagrams illustrating a second control method according to the first embodiment.

FIG. 23 is a diagram representing an example of a voltage set for a shield electrode.

DESCRIPTION OF EMBODIMENTS

Hereinafter, embodiments of the present technology will be explained with reference to the figures. Note that the explanation follows the following order.
1. Configuration of Solid-State Imaging Device
2. Overview of the Present Technology
3. First Embodiment: Control of Setting Optimum Voltage for Shield Electrode
4. Second Embodiment: Structure of Divided Lower Electrode
5. Third Embodiment: Arrangement Variation of Shield Electrode
6. Fourth Embodiment: Another Arrangement Variation of Shield Electrode
7. Modification Example
8. Configuration of Electronic Apparatus
9. Usage Example of Solid-State Imaging Device
10. Application Example to Mobile Bodies 1. Configuration of Solid-State Imaging Device Configuration Example of Solid-State Imaging Device FIG. 1 is a diagram depicting a configuration example of an embodiment of the solid-state imaging device to which the present technology is applied.

Figure 1:
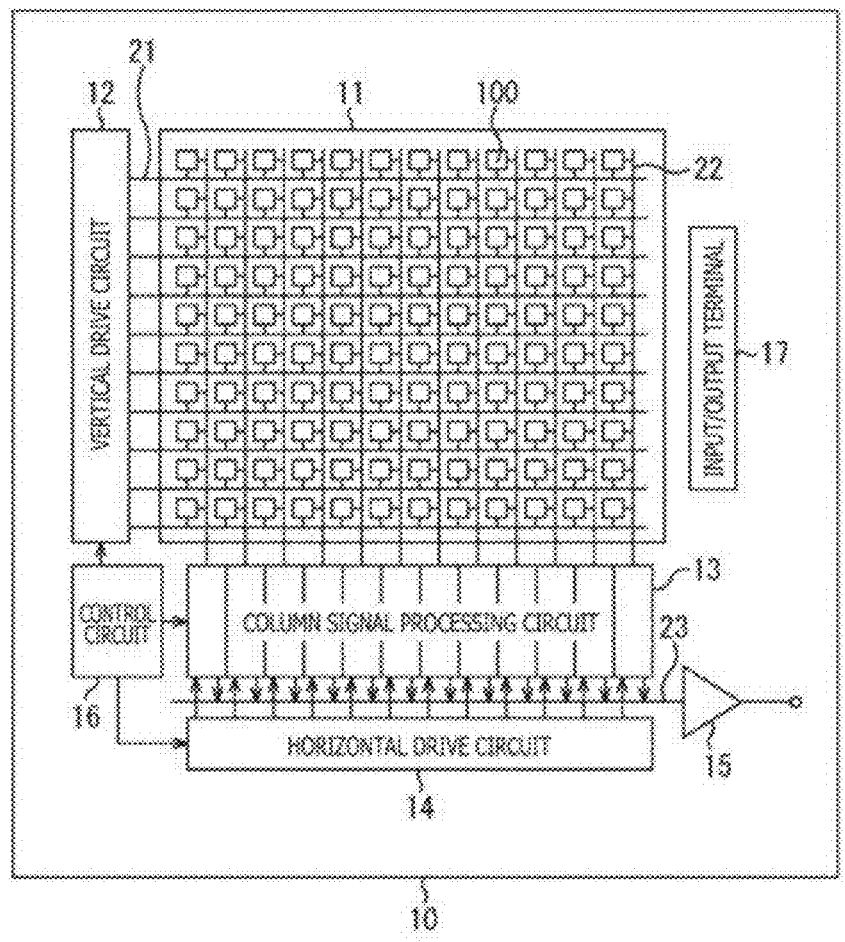
FIG. 1 is a diagram depicting a configuration example of an embodiment of a solid-state imaging device to which the present technology is applied.

A CMOS image sensor 10 in FIG. 1 is an example of a solid-state imaging device using a CMOS (Complementary Metal Oxide Semiconductor). The CMOS image sensor 10 takes in an incident light (image light) from a subject through an optical lens system (not illustrated in the figure), and converts an amount of incident light from which an image is formed on an imaging face into an electric signal in a pixel unit to output the electric signal as a pixel signal.

In FIG. 1, the CMOS image sensor 10 includes a pixel array section 11, a vertical drive circuit 12, column signal processing circuits 13, a horizontal drive circuit 14, an output circuit 15, a control circuit 16, and an input/output terminal 17.

A plurality of pixels 100 is two-dimensionally arranged (in a matrix form) in the pixel array section 11. The pixels 100 each include a photodiode (PD) as a photoelectric conversion section and a plurality of pixel transistors. For example, the pixel transistors include a transfer transistor, a reset transistor, an amplification transistor, and a selection transistor.

The vertical drive circuit 12 includes, for example, a shift register, selects a predetermined pixel drive line 21, and supplies a pulse for driving the pixels 100 to the selected pixel drive line 21 to drive the pixels 100 in each row. That is, the vertical drive circuit 12 selectively scans each pixel 100 in the pixel array section 11 row by row sequentially in the vertical direction, and supplies the pixel signals based on signal charges (electric charges) generated in the photodiode of each pixel 100 according to an amount of the received light to the column signal processing circuits 13 through vertical signal lines 22.

The column signal processing circuits 13 are arranged for the respective columns of the pixels 100, and process signals output from the pixels 100 in one row, for example eliminate noise, for each pixel column. For example, the column signal processing circuits 13 perform signal processing such as correlated double sampling (CDS) and AD (Analog Digital) conversion, for removing a fixed pattern noise peculiar to a pixel.

The horizontal drive circuit 14 includes, for example, a shift register, sequentially selects each of the column signal processing circuits 13 by sequentially outputting horizontal scanning pulses, and causes each of the column signal processing circuits 13 to output a pixel signal to a horizontal signal line 23.

The output circuit 15 processes and outputs signals sequentially supplied from each of the column signal processing circuits 13 through the horizontal signal line 23. It is to be noted that, in the output circuit 15, for example, only buffering is carried out in some cases, and adjustment of black level, correction of unevenness among columns, various kinds of digital signal processing, and the like are carried out in other cases.

The control circuit 16 controls the operation of each section in the CMOS image sensor 10.

In addition, the control circuit 16 generates clock signals or control signals fundamental to operations of the vertical drive circuit 12, the column signal processing circuits 13, the horizontal drive circuit 14, and the like, on the basis of vertical synchronous signals, horizontal synchronous signals, and master clock signals. The control circuit 16 outputs the generated clock signals and control signals to the vertical drive circuit 12, the column signal processing circuits 13, the horizontal drive circuit 14, and the like.

The input/output terminal 17 exchanges signals with the outside.

The CMOS image sensor 10 in FIG. 1 configured as described hereinbefore is regarded as a CMOS image sensor called a column AD type, in which the column signal processing circuits 13 for performing CDS processing and AD conversion processing are arranged for each pixel column. In addition, the CMOS image sensor 10 in FIG. 1 can be, for example, a back-illuminated type CMOS image sensor.

2. Overview of the Present Technology (Structure of General Pixel)

Figure 3:
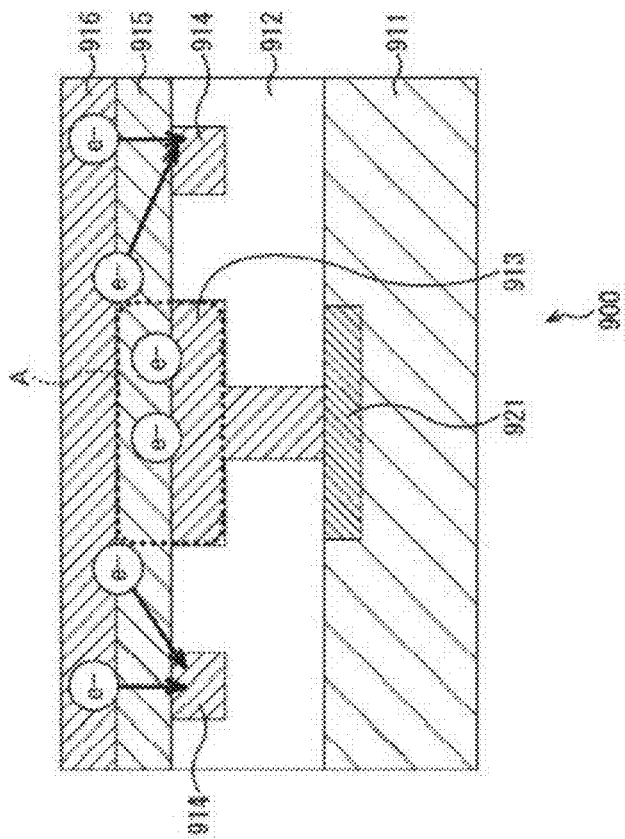
FIG. 3 is a sectional view depicting a structure of a general pixel.
Figure 4:
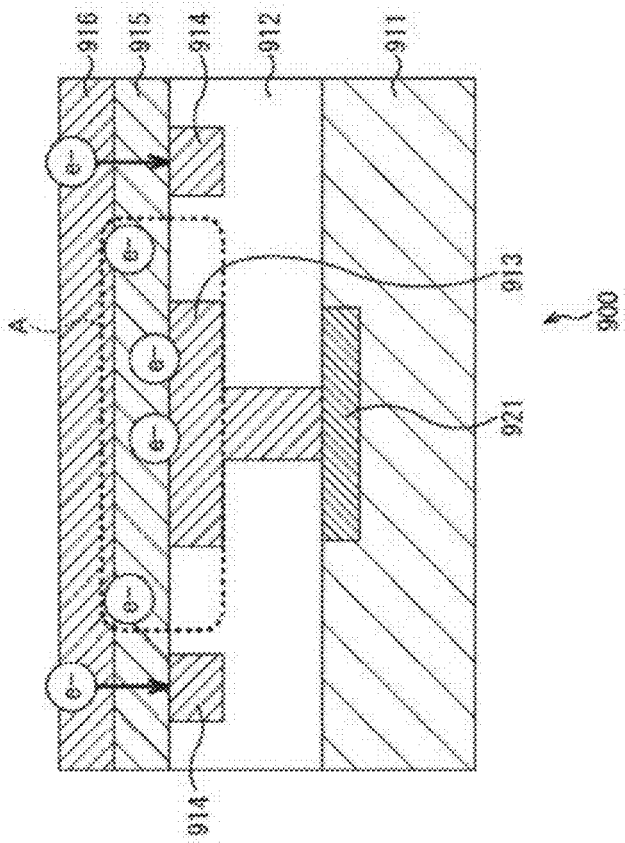
FIG. 4 is a sectional view depicting a structure of a general pixel.

First, a structure of a general pixel 900 will be explained with reference to the sectional views of FIG. 2 to FIG. 4.

Figure 2:
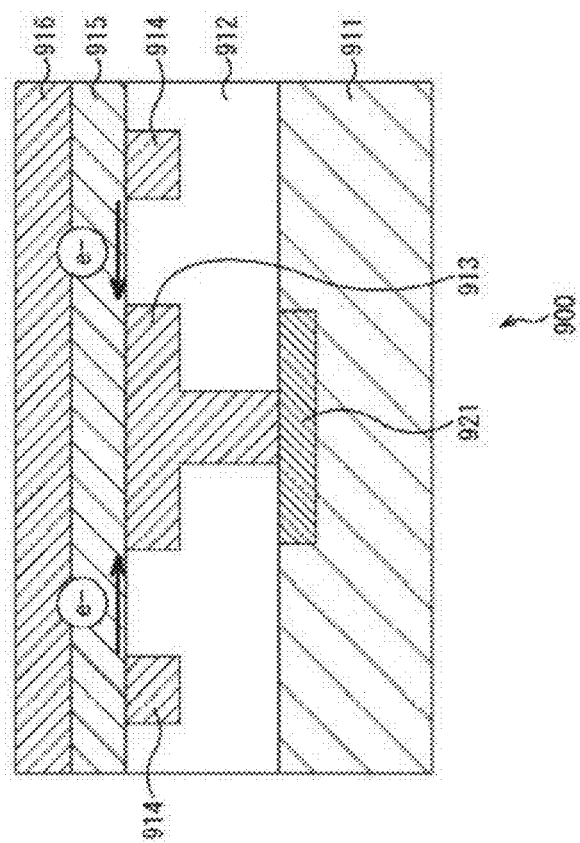
FIG. 2 is a sectional view depicting a structure of a general pixel.

In FIG. 2, in the general pixel 900, an interlayer insulating layer 912 and a photoelectric conversion layer 915 are laminated on an upper layer of a semiconductor layer 911. An upper electrode 916 and a lower electrode 913 for reading out the charges (signal charges) photoelectrically converted by the photoelectric conversion layer 915 are formed on the upper and lower faces of the photoelectric conversion layer 915.

The charges read out by the upper electrode 916 and the lower electrode 913 are accumulated in a floating diffusion (FD) region 921 formed on the semiconductor layer 911, and converted into voltage signals.

In FIG. 2, between the lower electrodes 913 formed in the pixels 900 i.e., between the adjacent lower electrodes 913, a shield electrode 914 electrically insulated from the lower electrodes 913 is formed. The shield electrode 914 is formed so as to surround the lower electrode 913 formed on each pixel 900, and the potential (voltage) is fixed.

Incidentally, an extremely large voltage difference between the shield electrode 914 and the lower electrode 913 causes a problem that the charges are injected from the shield electrode 914. FIG. 2 schematically depicts a state in which a charge represented by "e-" in the figure is injected from the shield electrode 914 side to a readout region on the lower electrode 913 side.

In addition, when the voltage difference between the shield electrode 914 and the lower electrode 913 is needlessly increased, the charges discharged from the shield electrode 914 become high, and the sensor sensitivity is decreased. FIG. 3 schematically depicts a state in which the charges represented by "e-" in the figure are needlessly discharged from the shield electrode 914. At this time, a readout region A (region surrounded by a dotted line in the figure) on the lower electrode 913 side is narrowed, and thus the read-out charges decrease.

On the other hand, an extremely small voltage difference between the shield electrode 914 and the lower electrode 913 causes a problem that excess charges too much to read out are generated, resulting in residual images. FIG. 4 schematically depicts a state in which although an amount of the charges discharged from the shield electrode 914 as the electric charges represented by "e-" in the figure is small, charges too much to read out are generated because a readout region A (region surrounded by a dotted line in the figure) on the lower electrode 913 side is too wide. At this time, the undischarged charges cannot be read out and remain, resulting in residual images.

As described hereinbefore, since the voltage of the shield electrode 914 is not set to an optimum voltage (variable voltage) in the general pixel 900, there may be a case in which a too large voltage difference between the shield electrode 914 and the lower electrode 913 is caused (the voltage of the shield electrode 914 is too high), or a case in which a too small voltage difference therebetween is caused (the voltage of the shield electrode 914 is too low) are caused.

Thus, in the present technology, the voltage of the shield electrode 914 is enabled to be set to an optimum voltage (variable voltage) to adjust the voltage difference between the shield electrode 914 and the lower electrode 913, so that decrease in the sensor sensitivity and generation of residual images can be suppressed, and therefore the properties of the pixels can be improved.

(Structure of Pixel in the Present Technology)

Figure 5:
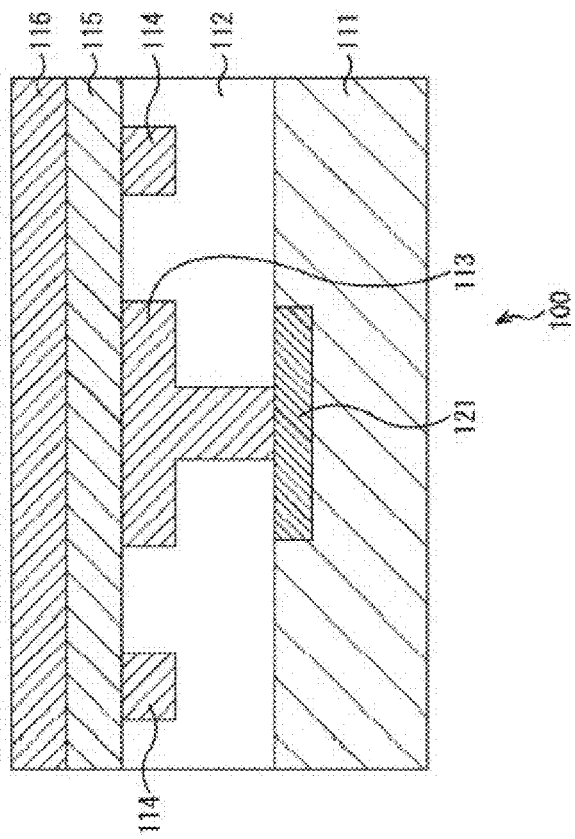
FIG. 5 is a sectional view depicting a structure of a pixel according to the present technology.

FIG. 5 is a sectional view depicting the structure of the pixel according to the present technology.

FIG. 5 depicts the pixel 100 located at any position among a plurality of pixels two-dimensionally arranged in the pixel array section 11 of the CMOS image sensor 10 in FIG. 1, as an example.

In the pixel 100, an interlayer insulating layer 112 and a photoelectric conversion layer 115 are laminated on an upper layer of a semiconductor layer 111 such as a silicon substrate. An upper electrode 116 and a lower electrode 113 are formed on the upper and lower faces of the photoelectric conversion layer 115 to read out charges (signal charges) photoelectrically converted by the photoelectric conversion layer 115.

In other words, the upper electrode 116 as the electrode on the light incidence side and the lower electrode 113 as the electrode on the silicon substrate side are formed respectively on the light incidence side and on the silicon substrate side of the photoelectric conversion layer 115, forming a structure in which the two electrodes sandwich the photoelectric conversion layer 115 to apply a voltage to the photoelectric conversion layer 115.

However, the upper electrode 116 is a transparent electrode, formed over the entire face of the photoelectric conversion layer 115, and common to all the pixels arranged in the pixel array section 11. On the other hand, the lower electrode 113 is a transparent electrode, and one lower electrode 113 is formed for each pixel in accordance with the pixel pitch.

The charges (signal charges) photoelectrically converted by the photoelectric conversion layer 115 are read out by the upper electrode 116 and the lower electrode 113, accumulated in a floating diffusion (FD) region 121 formed in the semiconductor layer 111, and converted into voltage signals.

In FIG. 5, between the lower electrodes 113 formed in the pixels 100 i.e., between the adjacent lower electrodes 113, a shield electrode 114 electrically insulated from the lower electrodes 113 is formed.

Figure 6:
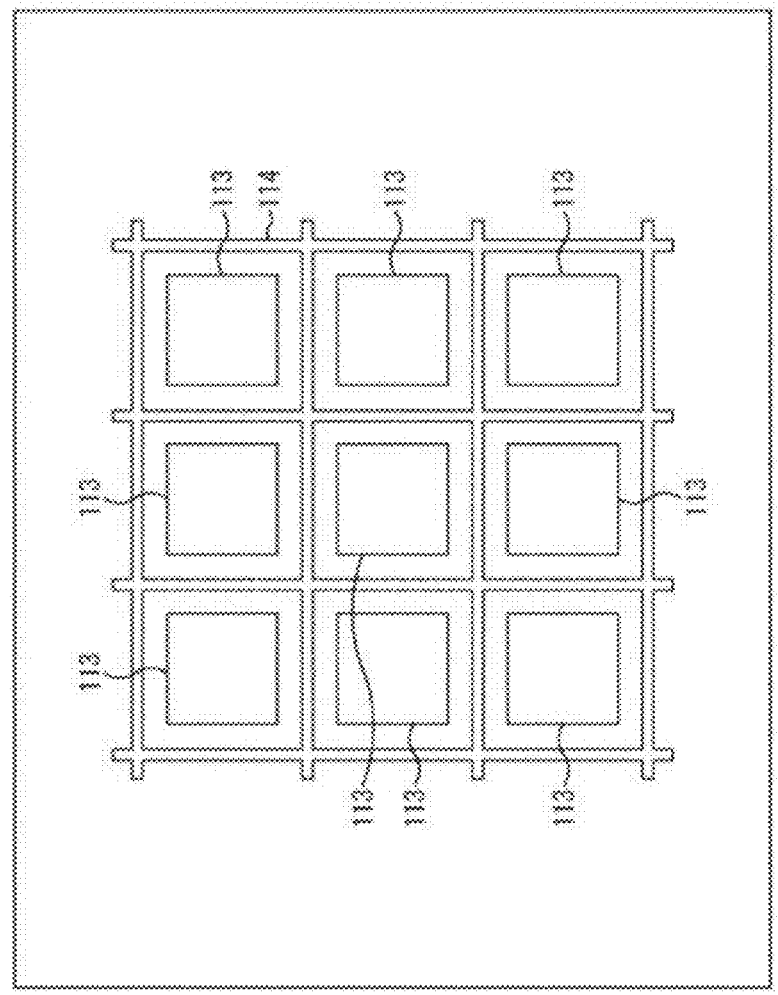
FIG. 6 is a plan view depicting the structure of the pixel according to the present technology.

FIG. 6 is a plan view in a case in which the shield electrode 114 formed for the lower electrode 113 is viewed from the light incidence side. As illustrated in FIG. 6, the shield electrode 114 is formed so as to surround the lower electrode 113 formed in each pixel 100.

In the present technology, in the pixel 100, the voltage of the shield electrode 114 formed between the adjacent lower electrodes 113 is controlled to an optimum voltage (variable voltage) to adjust the voltage difference between the shield electrode 114 and the lower electrode 113, so that the property of the pixel 100 is improved.

Hereinafter, specific contents of the present technology will be explained with reference to the first to fourth embodiments.

3. First Embodiment (First Pixel Structure)

First, the structure of the pixel 100 according to the first embodiment will be explained with reference to the sectional views of FIG. 7 to FIG. 9.

In the pixel 100, the voltage of the shield electrode 114 formed between the adjacent lower electrodes 113 can be set to a voltage allowing excess charges too much to read out to be discharged from the shield electrode 114, or a voltage allowing the readout region on the lower electrode 113 side to be within such a range that prevents decrease in sensitivity.

Figure 7:
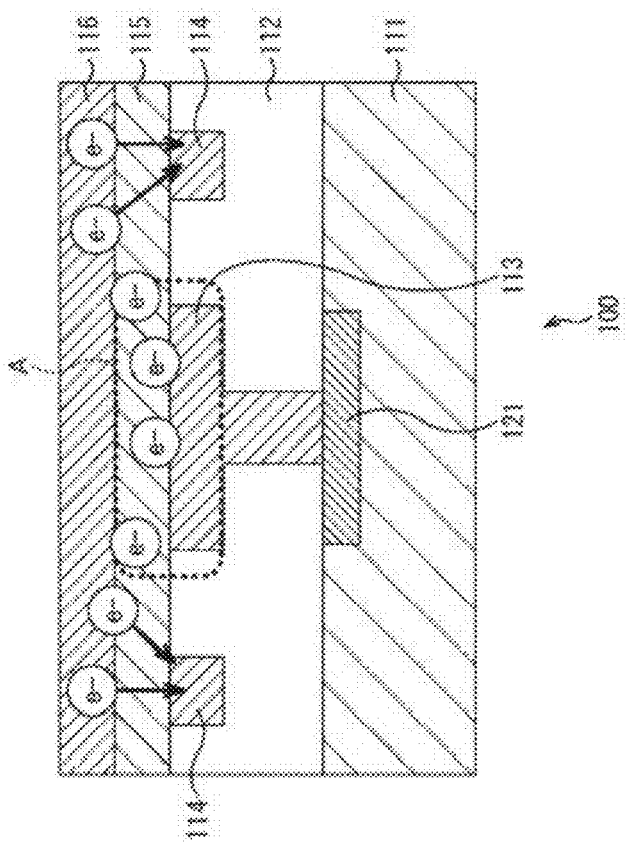
FIG. 7 is a sectional view depicting a structure of a pixel according to a first embodiment.
Figure 8:
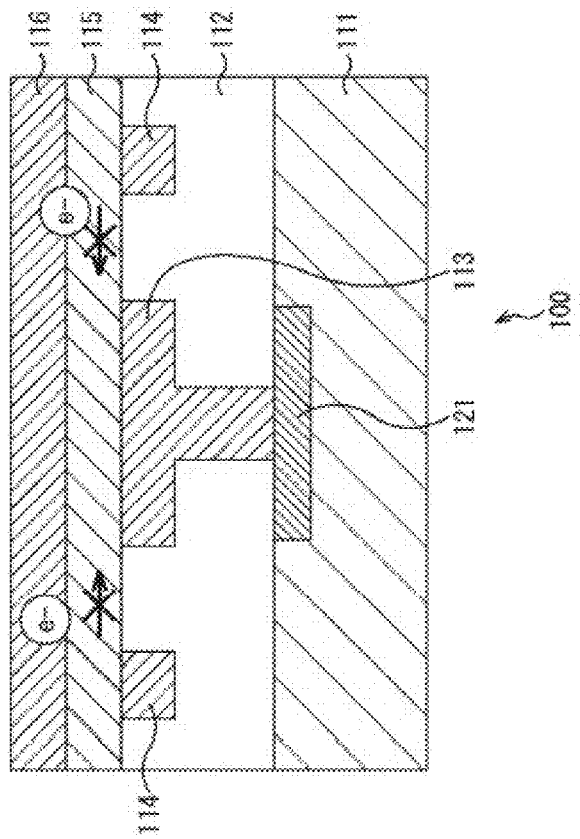
FIG. 8 is a sectional view depicting the structure of the pixel according to the first embodiment.

FIG. 7 schematically depicts a state in which excess charges too much to read out as the charges represented by "e-" in the figure are discharged from the shield electrode 114. In FIG. 7, a readout region A on the lower electrode 113 side (region surrounded by a dotted line in the figure) is within such a range that prevents decrease in the sensor sensitivity, and therefore, as the charges represented by the "e-" in the figure, the charges which can be read out do not decrease.

In the pixel 100, the voltage of the shield electrode 114 can be limited to a range where an electric current does not flow between the shield electrode 114 and the lower electrode 113. FIG. 8 schematically depicts a state in which the electric current (leak current) is prevented from flowing in directions of arrows in the figure between the shield electrode 114 and the lower electrode 113 by limiting the voltage of the shield electrode 114.

Then, in the pixel 100 according to the first embodiment, the voltage allowing excess charges too much to read out to be discharged from the shield electrode 114, or the voltage allowing the readout region A on the lower electrode 113 side to be within such a range that prevents decrease in sensitivity is set as an optimum voltage for the shield electrode 114.

It is to be noted here that the optimum voltage refers to a voltage of the shield electrode 114 which maximizes the sensor sensitivity without causing the leak current from the shield electrode 114 to the lower electrode 113, and without causing the excess charges too much to read out.

Figure 9:
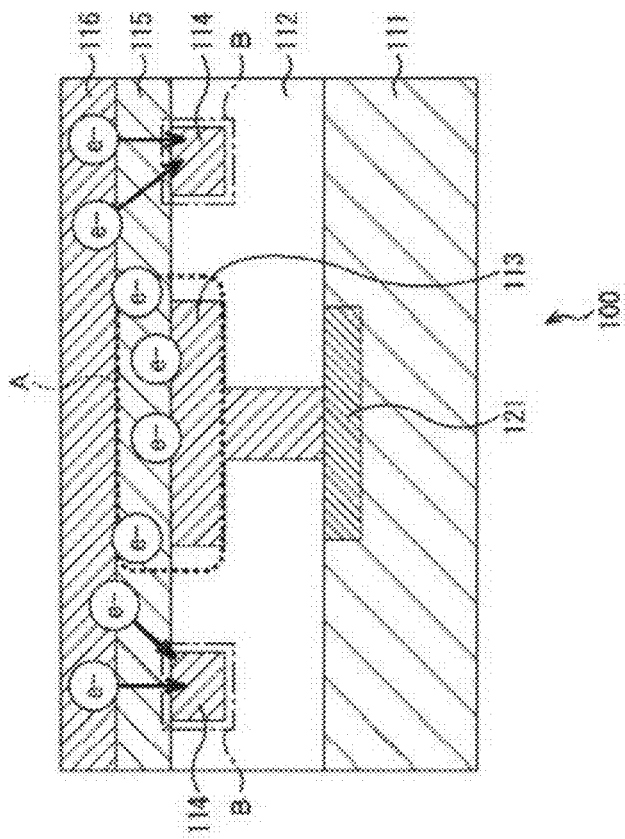
FIG. 9 is a sectional view depicting the structure of the pixel according to the first embodiment.

FIG. 9 schematically depicts a state in which the voltage of the shield electrode 114 expressed by a region B in the figure is controlled to be an optimum voltage to discharge the excess charges too much to read out as the charges represented by "e-" in the figure, from the shield electrode 114. In this case, unnecessary charges can be discharged to suppress generation of excess charges too much to read out, and thereby residual images can be suppressed.

In FIG. 9, the readout region A on the lower electrode 113 side is within such a range that prevents decrease in the sensor sensitivity by controlling the voltage of the shield electrode 114 to an optimum voltage. Thus, the read-out charges as the charges represented by "e-" in the figure do not decrease. In this case, readout of the charges is assisted, more charges are taken in, and thus decrease in the sensor sensitivity can be suppressed.

As described hereinbefore, in the pixel 100 according to the first embodiment, an optimum voltage for the shield electrode 114 formed between the adjacent lower electrodes 113 is detected, and the optimum voltage is set as the voltage of the shield electrode 114. Hereinafter, as such an optimum voltage control method, first to fifth control methods will be explained.

(1) First Control Method

Figure 10B:
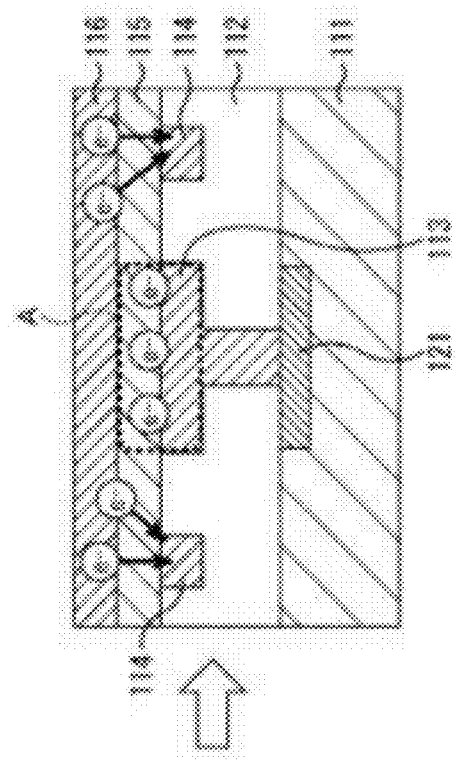
FIGS. 10A and 10B are diagrams illustrating a first control method according to the first embodiment.
Figure 10A:
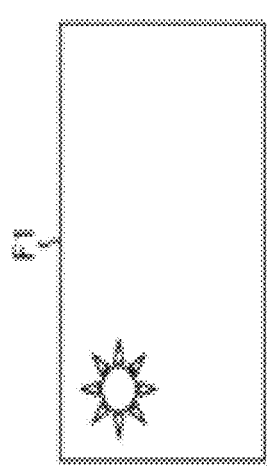

First, the first control method will be explained with reference to FIGS. 10A, 10B, 11A, 11B, and 12. In this first control method, the voltage of the shield electrode 114 during exposure is set to an optimum voltage according to output of a frame obtained before the exposure (hereinafter, referred to as a previous frame image). FIGS. 10A and 10B depict an example of control in a case in which a bright image is obtained as the previous frame image. FIGS. 10A and 10B depicts a state in which, in a case in which a bright image as illustrated in FIG. 10A is obtained as a previous frame image F1, control as illustrated in FIG. 10B is performed during exposure.

That is, in a case in which a level (for example, level of contrast, luminance, or the like) corresponding to the previous frame image F1 is higher than a predetermined threshold value and the previous frame image F1 is determined as a bright image, the voltage set for the shield electrode 114 during exposure is lowered to discharge unnecessary charges.

Figure 11B:
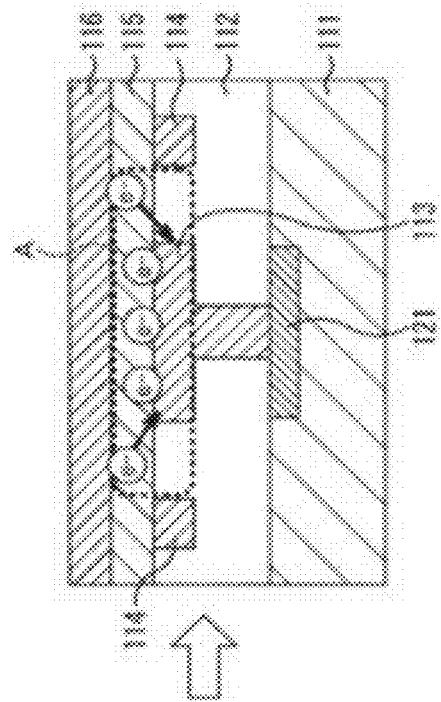
FIGS. 11A and 11B are diagrams illustrating the first control method according to the first embodiment.
Figure 11A:
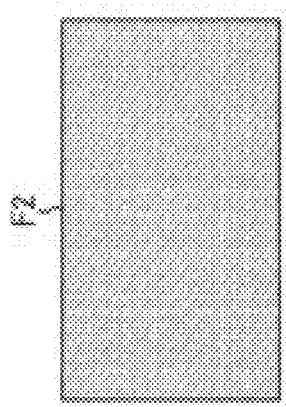

FIG. 10B schematically depicts a state in which unnecessary charges are discharged from the shield electrode 114 for which a low voltage is set. As described hereinbefore, unnecessary charges are discharged to suppress generation of excess charges too much to read out, so that generation of residual images on a captured image (frame image obtained after the previous frame image) can be suppressed On the other hand, FIGS. 11A and 11B depict an example of control in a case in which a dark image is obtained as the previous frame image. FIGS. 11A and 11B depict a state in which, in a case in which a dark image as illustrated in FIG. 11A is obtained as a previous frame image F2, control as illustrated in FIG. 11B is performed during exposure.

That is, in a case in which a level (for example, level of contrast, luminance, or the like) corresponding to the previous frame image F2 is lower than a predetermined threshold value and the previous frame image F2 is determined as a dark image, the voltage set for the shield electrode 114 during exposure is increased to take in more charges.

FIG. 11B schematically depicts a state in which, in a case in which a high voltage is set for the shield electrode 114, more charges are taken in in the readout region A on the lower electrode 113 side. As described hereinbefore, the shield electrode 114 assists the charge transfer to take in more charges, so that decrease in the sensor sensitivity can be suppressed.

Figure 12:
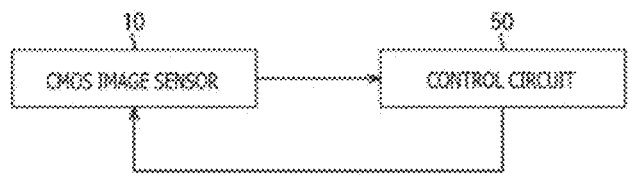
FIG. 12 is a diagram illustrating the first control method according to the first embodiment.

FIG. 12 depicts a configuration in a case in which the voltage of the shield electrode 114 corresponding to output of the previous frame image is set by an external control circuit 50.

In FIG. 12, the control circuit 50 performs control (feedback control) such that the voltage set for the shield electrode 114 during exposure is optimum, on the basis of the result of analyzing the previous image frame output from the CMOS image sensor 10.

Specifically, in a case in which the previous frame image is determined as a bright image, the control circuit 50 sets the voltage of the shield electrode 114 to a low value, and in a case in which the previous frame image is determined as a dark image, the control circuit 50 sets the voltage of the shield electrode 114 to a high value.

In this feedback control, the level of the voltage set for the shield electrode 114 by the control circuit 50 is determined depending on the voltage difference from the voltage of the lower electrode 113. In a case in which the voltage of the lower electrode 113 is low, the charge transfer can be assisted by increasing the voltage of the shield electrode 114. On the other hand, in a case in which the voltage of the lower electrode 113 is high, unnecessary charges can be discharged by decreasing the voltage of the shield electrode 114. In addition, the level of the voltage set for the shield electrode 114 can be determined depending on, for example, an amount of charges to be assisted for the transfer, an amount of unnecessary charges to be discharged, or the like.

As the threshold value used in the determination described hereinbefore, an arbitrary value can be set according, for example, to a determination criterion of whether the previous frame image is a bright image or a dark image, and the like.

Although FIG. 12 depicts the configuration in which the control circuit 50 is disposed outside the CMOS image sensor 10, the control circuit 50 may be disposed inside the CMOS image sensor 10. In this case, feedback control in accordance with the first control method is performed by the control circuit 50 inside the CMOS image sensor 10.

(2) Second Control Method

Next, the second control method will be explained with reference to FIGS. 13A, 13B, 13C, and 13D. In this second control method, according to a reset level output of the pixel 100, the voltage of the shield electrode 114 during a signal level output is set to an optimum voltage.

Correlated double sampling (CDS) is intended to obtain signal components from which noise components are removed, by taking a difference between the reset level obtained after reset and the signal level obtained during exposure. In the second control method, the voltage of the shield electrode 114 can be set to an optimum voltage by utilizing the principle of this correlated double sampling (CDS).

FIGS. 13A, 13B, 13C, and 13D depicts a series of control flow in accordance with the second control method utilizing the principle of correlated double sampling (CDS).

In FIGS. 13A, 13B, 13C, and 13D, a sensor section 30 corresponds to the whole or a part of the pixel array section 11 of the CMOS image sensor 10 (FIG. 1), and includes the two-dimensionally arranged pixels 100. Additionally, in FIGS. 13A, 13B, 13C, and 13D, a CDS circuit 40 corresponds to the whole or a part of the column signal processing circuit 13 in the CMOS image sensor 10 (FIG. 1), and performs the correlated double sampling (CDS).

Figure 13A:
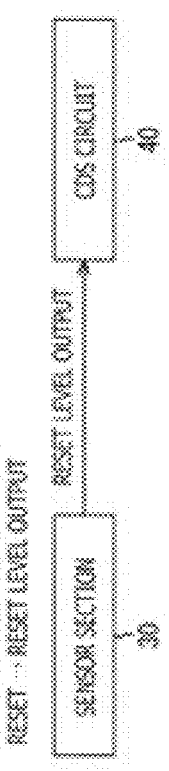

First, as illustrated in FIG. 13A, in the sensor section 30, the floating diffusion region 121 in the pixel 100 is reset during a reset period temporally before an exposure period, and the resulting reset level is output to the CDS circuit 40.

Figure 13B:
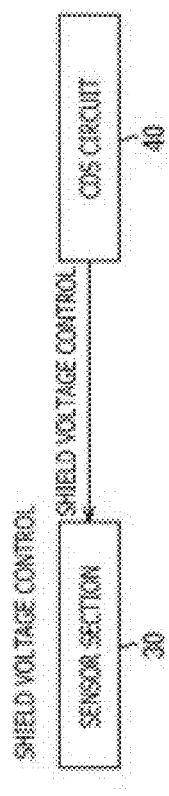

Next, as illustrated in FIG. 13B, in the CDS circuit 40, the voltage of the shield electrode 114 during the signal level output (exposure) is controlled (feedback-controlled) according to the reset level output from the sensor section 30.

That is, in a case in which the level corresponding to the reset level is higher than a predetermined threshold value, the voltage set for the shield electrode 114 during the signal level output is decreased to discharge unnecessary charges. On the other hand, in a case in which the level corresponding to the reset level is lower than the predetermined threshold value, the voltage set for shield electrode 114 during the signal level output is increased to assist the charge transfer.

Figure 13C:
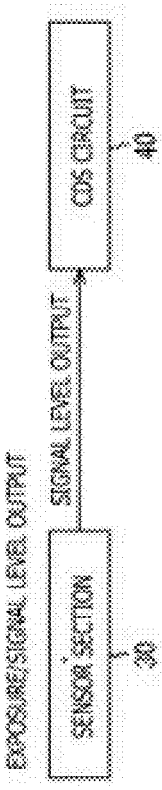

Next, as illustrated in FIG. 13C, in the sensor section 30, charges are accumulated in the floating diffusion region 121 in the pixel 100 during exposure, and a signal level corresponding to the charges is read out and output to the CDS circuit 40.

At this time, in the pixel 100, the voltage of the shield electrode 114 is feedback-controlled from the CDS circuit 40, and thus in a case in which the reset level is high, the voltage of the shield electrode 114 is set to a low value to discharge unnecessary charges. Hence, generation of residual images on the captured image can be suppressed. In addition, in a case in which the reset level is low, the voltage of the shield electrode 114 is set to a high value to take in more charges. Hence, decrease in the sensor sensitivity can be suppressed.

Finally, as illustrated in FIG. 13D, in the CDS circuit 40, correlated double sampling (CDS) is performed by taking the difference between the reset level output from the sensor section 30 and the signal level, and a post-CDS captured image obtained from the signal components from which the noise components have been removed is output.

Incidentally, as a threshold value used in the determination described hereinbefore, any value can be set according, for example, to a determination criterion for the level of the reset level output, or the like.

Although FIGS. 13A, 13B, 13C, and 13D depict the configuration in which, as the column signal processing circuit 13 (FIG. 1), the CDS circuit 40 is disposed inside the CMOS image sensor 10, the CDS circuit 40 may be disposed outside the CMOS image sensor 10. In this case, feedback control in accordance with the second control method is performed by the CDS circuit 40 disposed outside the CMOS image sensor 10.

(3) Third Control Method

Next, the third control method will be explained with reference to FIG. 14. In the third control method, the voltage of the shield electrode 114 during imaging is set to an optimum voltage according to the result of detecting the temperature obtained from a temperature sensor.

Figure 14:
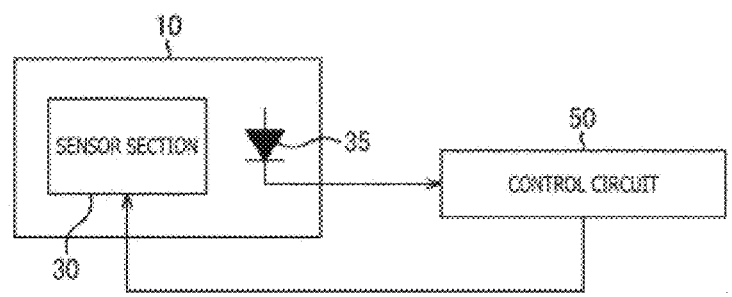
FIG. 14 is a diagram illustrating a third control method according to the first embodiment.

FIG. 14 depicts a configuration in a case in which the external control circuit 50 sets the voltage of the shield electrode 114 according to the result of detecting the temperature from a temperature sensor 35.

In FIG. 14, the temperature sensor 35 is disposed inside the CMOS image sensor 10 together with the sensor section 30. The sensor section 30 corresponds to the whole or a part of the pixel array section 11 (FIG. 1), and includes the two-dimensionally arranged pixels 100. That is, in FIG. 14, the temperature sensor 35 is disposed in the vicinity of the pixel 100 disposed on the sensor section 30.

Although the configuration of FIG. 14 depicts a case in which the temperature sensor 35 is disposed inside the CMOS image sensor 10 as an example, the temperature sensor 35 may be disposed outside the CMOS image sensor 10.

The temperature sensor 35 regularly detects the temperature inside the CMOS image sensor 10 and outputs the result of detecting the temperature to the control circuit 50.

The control circuit 50 controls (feedback-controls) the voltage of the shield electrode 114 during imaging, according to the result of detecting the temperature output from the temperature sensor 35.

That is, in a case in which the level corresponding to the temperature detected by the temperature sensor 35 is higher than a predetermined threshold value, the voltage set for the shield electrode 114 during imaging is decreased to discharge unnecessary charges. As a result, generation of residual images on the captured image can be suppressed.

On the other hand, in a case in which the level corresponding to the temperature detected by the temperature sensor 35 is lower than the predetermined threshold value, the voltage set for the shield electrode 114 during imaging is increased to assist the charge transfer. As a result, decrease in the sensor sensitivity can be suppressed.

Incidentally, as a threshold value used in the determination described hereinbefore, any value can be set according, for example, to the determination criterion for the level of the detected temperature, or the like.

Although FIG. 14 depicts the configuration in which the control circuit 50 is disposed outside the CMOS image sensor 10, the control circuit 50 may be disposed inside the CMOS image sensor 10. In this case, the control circuit 50 inside the CMOS image sensor 10 performs the feedback control in accordance with the third control method.

(4) Fourth Control Method

Next, the fourth control method will be explained with reference to FIG. 15. In the fourth control method, the voltage of the shield electrode 114 during imaging is set to an optimum voltage according to output of a light-shielding pixel.

Figure 15:
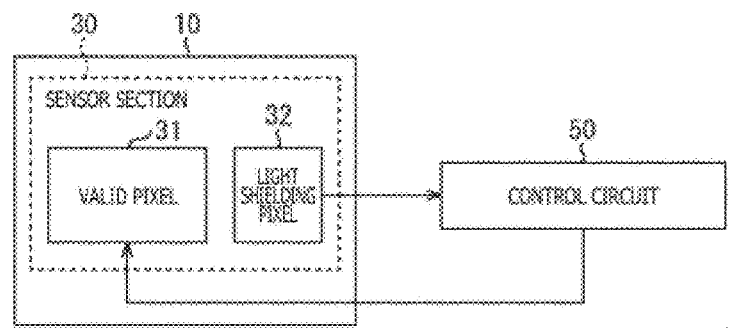
FIG. 15 is a diagram illustrating a fourth control method according to the first embodiment.

FIG. 15 depicts a configuration in a case in which the external control circuit 50 sets the voltage of the shield electrode 114 disposed for a valid pixel 31 according to output of a light-shielding pixel 32.

In FIG. 15, the sensor section 30 corresponds to the whole or a part of the pixel array section 11 (FIG. 1) and includes two-dimensionally arranged pixels 100. That is, among the plurality of pixels 100 two-dimensionally arrayed on the sensor section 30, the valid pixels 31 and the light-shielding pixels 32 are arbitrary pixels, and pixels other than the light-shielding pixels 32 are regarded as the valid pixels 31.

Here, the light-shielding pixel 32 is also referred to as an OPB (Optical Black) pixel and has a structure similar to that of the valid pixel 31, but is configured such that light is shielded by a light shielding film and thus an incident light does not reach. A black reference can be determined by signals output from this light-shielding pixel 32. For example, the light-shielding pixels 32 are arranged around (in a nearby area of) an area on which the valid pixel 31 is arranged.

The control circuit 50 controls (feedback-controls) the voltage of the shield electrode 114 of the valid pixel 31 during imaging, according to the signals output from the light-shielding pixel 32.

That is, in a case in which the level corresponding to the output from the light-shielding pixel 32 is higher than a predetermined threshold value, the voltage set for the shield electrode 114 disposed for the valid pixel 31 during imaging is decreased to discharge unnecessary charges. As a result, generation of residual images on the captured image can be suppressed.

On the other hand, in a case in which the level corresponding to the output from the light-shielding pixel 32 is lower than the predetermined threshold value, the voltage set for the shield electrode 114 disposed for the valid pixel 31 during imaging is increased to assist the charge transfer. As a result, decrease in the sensor sensitivity can be suppressed.

Incidentally, as a threshold value used in the determination described hereinbefore, any value can be set according, for example, to a determination criterion for the output level of the light-shielding pixel 32, or the like.

Although FIG. 15 depicts the configuration in which the control circuit 50 is disposed outside the CMOS image sensor 10, the control circuit 50 may be disposed inside the CMOS image sensor 10. In this case, the control circuit 50 inside the CMOS image sensor 10 performs the feedback control in accordance with the fourth control method.

(5) Fifth Control Method

Finally, the fifth control method will be explained with reference to FIG. 16. In the fifth control method, the voltage of the shield electrode 114 during imaging is set to an optimum voltage according to a gain set for the CMOS image sensor 10.

Figure 16:
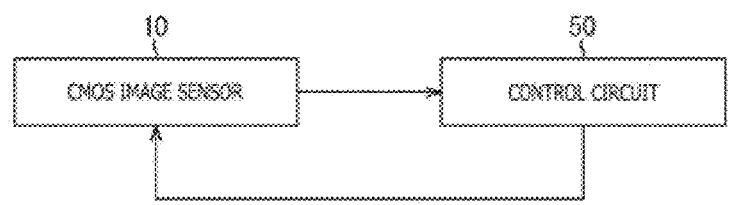
FIG. 16 is a diagram illustrating a fifth control method according to the first embodiment.

FIG. 16 depicts a configuration in a case in which the external control circuit 50 sets the voltage of the shield electrode 114 according to the set gain.

The control circuit 50 sets a gain for the CMOS image sensor 10. In addition, the control circuit 50 controls (feedback-controls) the voltage of the shield electrode 114 during imaging, according to a preset gain.

That is, in a case in which the level corresponding to the preset gain is lower than a predetermined threshold value, the voltage set for the shield electrode 114 is decreased to discharge unnecessary charges. As a result, generation of residual images on the captured image can be suppressed.

On the other hand, in a case in which the level corresponding to the preset gain is higher than the predetermined threshold value, the voltage set to the shield electrode 114 is increased to assist the charge transfer. As a result, decrease in the sensor sensitivity can be suppressed.

Incidentally, as a threshold value used in the determination described hereinbefore, any value can be set according, for example, to a determination criterion for the level of the set gain, or the like.

Although FIG. 16 depicts the configuration in which the control circuit 50 is disposed outside the CMOS image sensor 10, the control circuit 50 may be disposed inside the CMOS image sensor 10. In this case, the control circuit 50 inside the CMOS image sensor 10 performs the feedback control in accordance with the fifth control method.

Although the first to fifth control methods are explained hereinbefore as the control method according to the first embodiment, these control methods are merely examples, and other control methods may be used.

4. Second Embodiment (Second Pixel Structure)

Next, a pixel structure according of the second embodiment will be explained with reference to FIG. 17 and FIG. 18.

Figure 17:
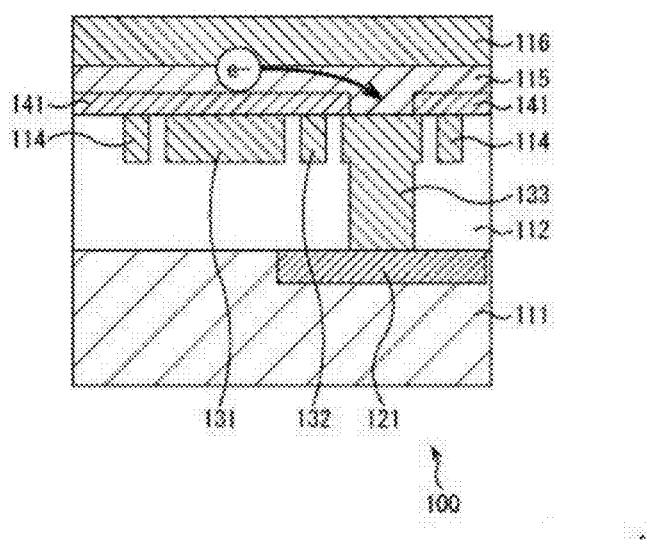
FIG. 17 is a sectional view depicting a structure of a pixel according to a second embodiment.

FIG. 17 is a sectional view depicting the pixel structure according to the second embodiment.

In the pixel 100 of FIG. 17, the lower electrode 113 described hereinbefore (FIG. 5 and the like) is divided into an accumulation electrode 131, a transfer electrode 132, and a readout electrode 133. In addition, an insulation film 141 is formed on the lower face of the photoelectric conversion layer 115 except for a part of the upper face of the readout electrode 133.

The accumulation electrode 131 is an electrode for accumulating charges. The transfer electrode 132 is an electrode for transferring the charges accumulated in the accumulation electrode 131. The readout electrode 133 is an electrode for reading out the charges transferred from the transfer electrode 132.

The charges photoelectrically converted by the photoelectric conversion layer 115 are read out by the upper electrode 116 and the readout electrode 133, accumulated in a floating diffusion region (FD) formed in the semiconductor layer 111, and converted into voltage signals.

Figure 18:
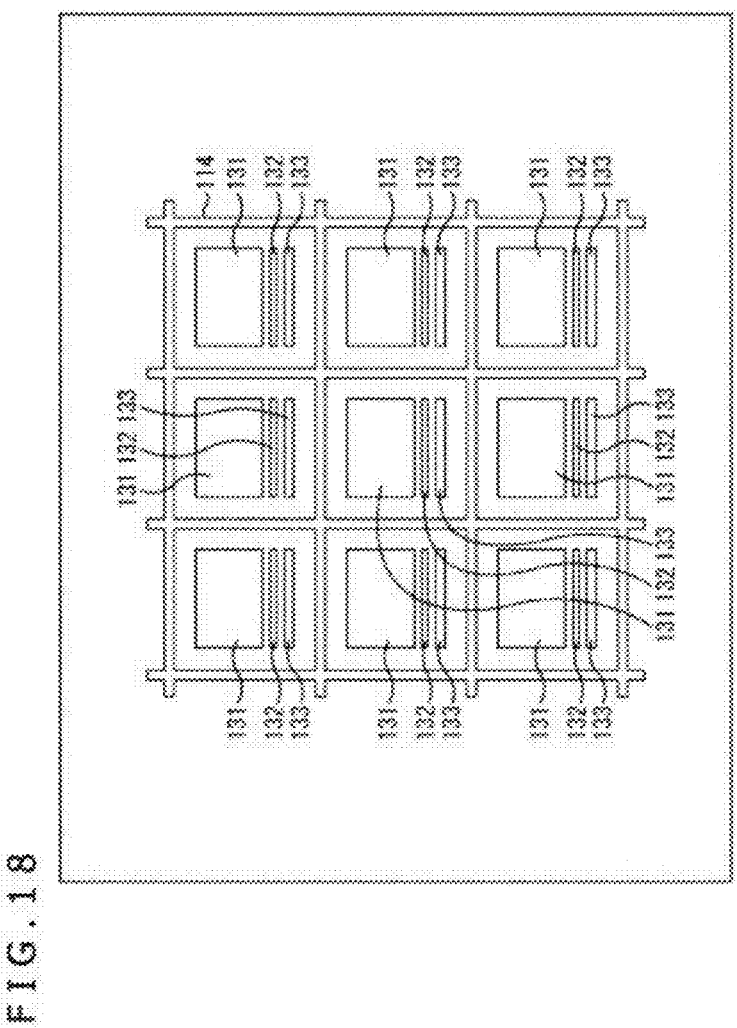
FIG. 18 is a plan view depicting the structure of the pixel according to the second embodiment.

FIG. 18 is a plan view in a case in which the shield electrode 114 formed for the accumulation electrode 131, the transfer electrode 132, and the readout electrode 133 is viewed from the light incidence side. As illustrated in FIG. 18, the shield electrode 114 is formed so as to surround the accumulation electrode 131, the transfer electrode 132, and the readout electrode 133 which are formed on each pixel 100.

In the second embodiment, the voltage of the shield electrode 114 formed between the accumulation electrodes 131, the transfer electrodes 132, and the readout electrodes 133 in the adjacent pixels 100 can be controlled to an optimum voltage to improve the property of the pixel 100.

In the second embodiment, as the method for controlling the voltage of the shield electrode 114 to an optimum voltage, any control method among the first to the fifth control methods explained hereinbefore in the first embodiment can be used.

5. Third Embodiment (Third Pixel Structure)

Next, a pixel structure according to the third embodiment will be explained with reference to FIG. 19 and FIG. 21.

Since a sectional structure of the pixel 100 according to the third embodiment is similar to the sectional structure of the pixel 100 illustrated in FIG. 5, explanation thereof is omitted in the third embodiment.

Figure 19:
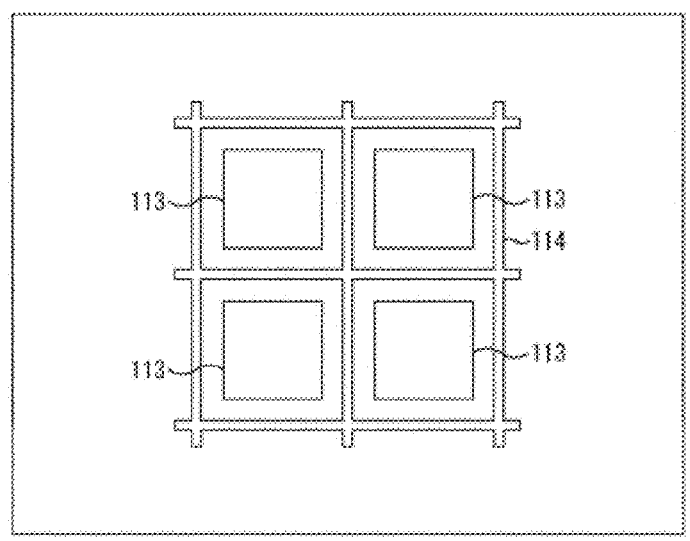
FIG. 19 is a plan view depicting a structure of a pixel according to a third embodiment.
Figure 20:
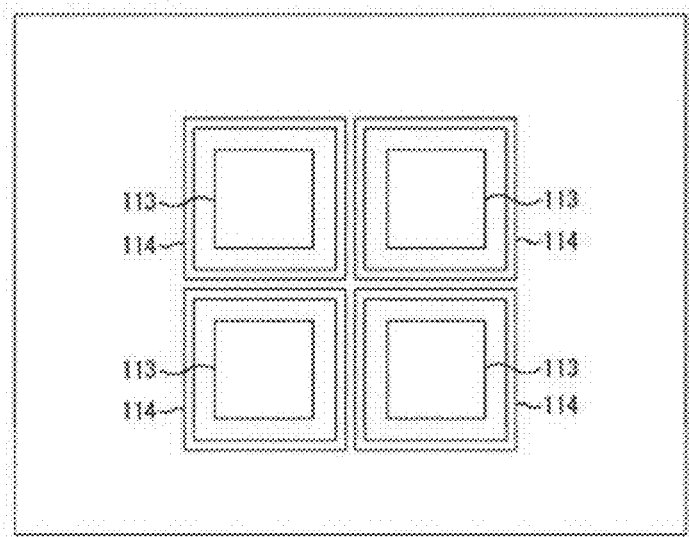
FIG. 20 is a plan view depicting the structure of the pixel according to the third embodiment.
Figure 21:
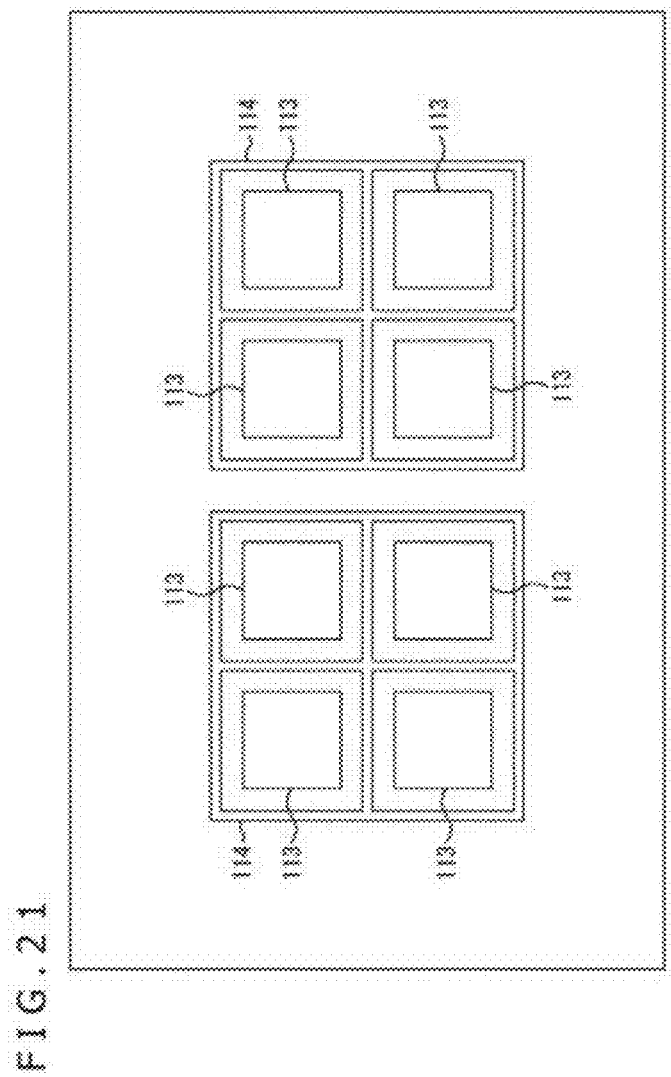
FIG. 21 is a plan view depicting the structure of the pixel according to the third embodiment.

FIG. 19 to FIG. 21 are plan views in a case in which the shield electrode 114 formed for the lower electrode 113 is viewed from the light incidence side. As illustrated in FIG. 19 to FIG. 21, the shield electrode 114 is formed so as to surround the lower electrode 113 which is formed for each pixel 100.

FIG. 19 depicts a configuration in a case in which one shield electrode 114 is disposed for all the pixels.

In FIG. 19, one shield electrode 114 is lattice-likely formed for all the pixels 100 two-dimensionally arranged in the pixel array section 11 (FIG. 1), and the lower electrodes 113 formed for the respective pixels 100 are surrounded by the common shield electrode 114.

In this case, the voltage of the shield electrode 114 is controlled in all the pixels in common. For this reason, the voltage of the shield electrode 114 can be more easily controlled to an optimum voltage compared to a case in which control is performed by a one-pixel unit or a plural-pixel unit.

FIG. 20 depicts a configuration in a case in which one shield electrode 114 is disposed for one pixel.

In FIG. 20, one shield electrode 114 is formed in a square shape on each of pixels 100 two-dimensionally arranged in the pixel array section 11 (FIG. 1), and the lower electrodes 113 formed for the respective pixels 100 are individually surrounded by the different shield electrodes 114.

In this case, the voltage of the shield electrode 114 can be controlled for each pixel. Thus, the voltage of the shield electrode 114 can be more finely controlled to an optimum voltage, compared to a case in which the control is performed by an all-pixel unit or a plural-pixel unit. However, in FIG. 20, the voltage may be controlled not only for each pixel, but also in all the pixels in common, or by the plural-pixel unit.

FIG. 21 depicts a configuration in a case in which one shield electrode 114 is disposed for a plurality of pixels.

In FIG. 21, one shield electrode 114 is formed for each unit of grouped plural pixels two-dimensionally arranged in the pixel array section 11 (FIG. 1), and the lower electrodes 113 formed on the respective pixels 100 are surrounded by the common shield electrode 114 in each group. For example, in the example of FIG. 21, pixels are grouped by a four-pixel unit, and one shield electrode 114 is four-squarely formed for four pixels.

In this case, the voltage of the shield electrode 114 can be controlled by the plural-pixel unit. For this reason, the voltage of the shield electrode 114 can be more finely controlled to an optimum voltage compared to a case in which the control is performed for all the pixels in common. In addition, the voltage of the shield electrode 114 can be more easily controlled to an optimum voltage compared to a case in which the control is performed by a one-pixel unit. However, in FIG. 21, the voltage may be controlled not only by the plural-pixel unit but also for all the pixels in common.

In the third embodiment, the voltage of the shield electrode 114 formed between the lower electrodes 113 of the adjacent pixels 100 can be controlled to an optimum voltage to improve the property of the pixel 100.

In the third embodiment, as the method for controlling the voltage of the shield electrode 114 to an optimum voltage, any control method among the first to the fifth control methods explained hereinbefore in the first embodiment can be used.

In the above explanation, although the lower electrode 113 formed for each pixel 100 is explained as being surrounded by the shield electrode 114, it is sufficient that the shield electrode 114 is formed on at least one side of four sides of the lower electrode 113.

For example, in a case in which one shield electrode 114 is four-squarely formed for four pixels as illustrated in FIG. 21, the cross-shaped portion of the shield electrode 114 may be omitted. However, the property of the pixel 100 can be more improved in the case in which the circumference of the lower electrode 113 is surrounded by the shield electrode 114.

6. Fourth Embodiment (Fourth Pixel Structure)

Next, a pixel structure according to the fourth embodiment will be explained with reference to FIG. 22.

Since a sectional structure of the pixel 100 according to the fourth embodiment is basically similar to the sectional structure of the pixel 100 illustrated in FIG. 5, explanation thereof is omitted here.

Figure 22:
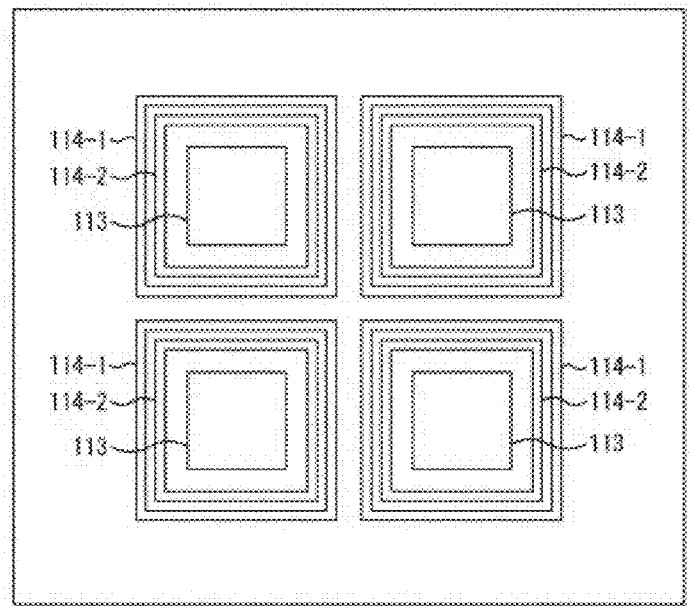
FIG. 22 is a plan view depicting a structure of a pixel according to a fourth embodiment.

FIG. 22 is a plan view in a case in which the shield electrode 114 formed for the lower electrode 113 is viewed from the light incidence side. As illustrated in FIG. 22, a shield electrode 114-1 and a shield electrode 114-2 are formed so as to doubly surround the lower electrode 113 formed for each pixel 100.

In FIG. 22, the two shield electrodes 114-1 and 114-2 are formed into square shapes having different sizes for each of the pixels 100 two-dimensionally arranged in the pixel array section 11 (FIG. 1), and the lower electrodes 113 formed for the respective pixels 100 are doubly surrounded by different shield electrodes 114-1 and 114-2.

In this case, the voltages of the two shield electrodes 114-1 and 114-2 can be controlled for each pixel. At this time, the shield electrodes 114-1 and 114-2 may be controlled in common or individually controlled. Thus, the voltage of the shield electrode 114 can be more finely controlled to an optimum voltage compared to a case in which the control is performed for all the pixels in common or by the plural-pixel unit. However, the voltage may be controlled not only by the one-pixel unit, but also for all the pixels in common or by the plural-pixel unit.

In the fourth embodiment, the voltages of the shield electrodes 114-1 and 114-2 formed between the lower electrodes 113 of the adjacent pixels 100 can be controlled to optimum voltages to improve the property of the pixel 100.

In the fourth embodiment, as the method for controlling the voltage of the shield electrode 114 to an optimum voltage, any control method among the first to the fifth control methods explained hereinbefore in the first embodiment can be used.

In the above explanation, although the case in which the lower electrode 113 formed for each pixel 100 is doubly surrounded by the shield electrode 114-1 and the shield electrode 114-2 is described, the lower electrode 113 may be surrounded triply or more by increased number of shield electrodes 114. For example, in this case, the voltage can be more finely controlled by individually controlling each of the shield electrodes 114 formed in superposition.

SUMMARY

As described hereinbefore, in the present technology, on the premise to control the voltage of the shield electrode 114 described in the first embodiment to an optimum voltage, the structures described in the second to fourth embodiments can be adopted.

FIG. 23 represents an example of the voltage of the shield electrode 114, which is set in a case in which the gain, the temperature, and the light amount are taken as factors in the control method described in the first embodiment.

In a case in which the gain is high, the voltage of the lower electrode 113 is low, and therefore the voltage of the shield electrode 114 is set to a high value for the purpose of assisting the charge transfer. On the other hand, in a case in which the gain is low, the voltage of the lower electrode 113 is high, and therefore the voltage of the shield electrode 114 is set to a low value for the purpose of discharging the charges.

In a case in which the temperature is high, the charges are easy to read out, and therefore the voltage of the shield electrode 114 is set to a low value for the purpose of discharging the charges. On the other hand, in a case in which the temperature is low, the charges are difficult to read out, and therefore the voltage of the shield electrode 114 is set to a high value for the purpose of assisting the charge transfer.

In a case in which the light amount is large, the voltage of the lower electrode 113 is high, and therefore the voltage of the shield electrode 114 is set to a low value for the purpose of discharging the charges. On the other hand, in a case in which the light amount is small, the voltage of the lower electrode 113 is low, and therefore the voltage of the shield electrode 114 is set to a high value for the purpose of assisting the charge transfer.

As described hereinbefore, the control method described in the first embodiment performs control such that the voltage of the shield electrode 114 is set to an optimum voltage according to the detection result which may contribute to control of the discharge or transfer of charges. This detection result can include at least one of the detection results regarding the light amount (including the gain) or the temperature.

7. Modification Example

In the above explanation, although the CMOS image sensor 10 (FIG. 1) is explained as a back-illuminated type, another structure of, for example, a front-illuminated type or the like may be adopted. In the above explanation, although the CMOS image sensor 10 is explained as the solid-state imaging device, the present technology can also be applied to other image sensors, for example, a CCD (Charge Coupled Device) image sensor or the like.

In the above explanation, the control circuit 50 is explained as being disposed outside or inside the CMOS image sensor 10, but in a case in which the control circuit 50 is disposed outside the CMOS image sensor 10, the control circuit 50 is configured as, for example, a CPU (Central Processing Unit) to allow the control with software processing. In a case in which the control circuit 50 is disposed inside the CMOS image sensor 10, the control circuit 50 may be in common with or different from the control circuit 16 (FIG. 1).

8. Configuration of Electronic Apparatus

Figure 24:
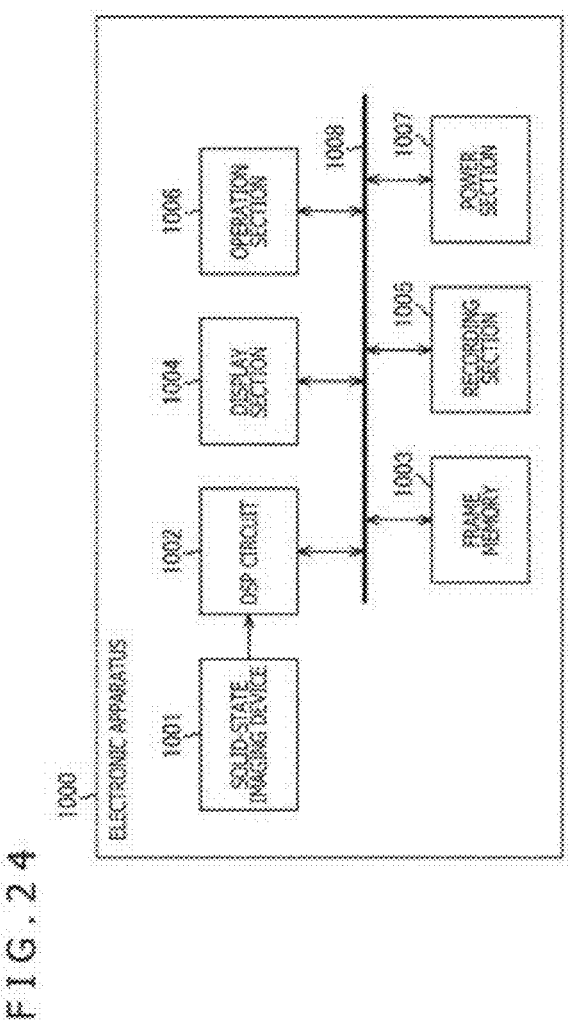
FIG. 24 a block diagram depicting a configuration example of an electronic apparatus having the solid-state imaging device to which the present technology is applied.

FIG. 24 is a block diagram depicting a configuration example of an electronic apparatus having a solid-state imaging device to which the present technology is applied.

An electronic apparatus 1000 is, for example, an electronic apparatus including an imaging device such as a digital still camera and a video camera, a portable terminal device such as a smartphone and a tablet type terminal, or the like.

The electronic apparatus 1000 includes a solid-state imaging device 1001, a DSP circuit 1002, a frame memory 1003, a display section 1004, a recording section 1005, an operation section 1006, and a power section 1007. In the electronic apparatus 1000, the DSP circuit 1002, the frame memory 1003, the display section 1004, the recording section 1005, the operation section 1006, and the power section 1007 are connected with each other via a bus line 1008.

The solid-state imaging device 1001 corresponds to the CMOS image sensor 10 (FIG. 1) described hereinbefore. For the pixels 100 two-dimensionally arranged in the pixel array section 11 (FIG. 1), control is performed such that an optimal voltage is set as the voltage of the shield electrode 114 formed between the adjacent lower electrodes 113.

The DSP circuit 1002 is a camera signal processing circuit for processing signals supplied from the solid-state imaging device 1001. The DSP circuit 1002 outputs image data obtained by processing signals from the solid-state imaging device 1001. The frame memory 1003 temporarily holds the image data processed by the DSP circuit 1002 by a frame unit.

The display section 1004 includes, for example, a panel type display device such as a liquid crystal panel and an organic EL (Electro Luminescence) panel, and displays a moving image or a still image captured by the solid-state imaging device 1001. The recording section 1005 records image data of the moving image or the still image captured by the solid-state imaging device 1001 in a recording medium such as a semiconductor memory and a hard disk.

The operation section 1006 outputs operation commands for various functions of the electronic apparatus 1000 in accordance with the operation by the user. The power section 1007 suitably supplies various powers as operation powers to the DSP circuit 1002, the frame memory 1003, the display section 1004, the recording section 1005 and the operation section 1006 to these supply targets.

The electronic apparatus 1000 is configured as described hereinbefore. The present technology is applied to the solid-state imaging device 1001 as explained hereinbefore. Specifically, the CMOS image sensor 10 (FIG. 1) can be applied to the solid-state imaging device 1001. With the present technology applied to the solid-state imaging device 1001, in each pixel 100, an optimum voltage is set as the voltage of the shield electrode 114 formed between the adjacent lower electrodes 113. Thus, the pixel property can be improved to suppress generation of residual images and decrease in the sensor sensitivity.

9. Usage Example of Solid-State Imaging Device

Figure 25:
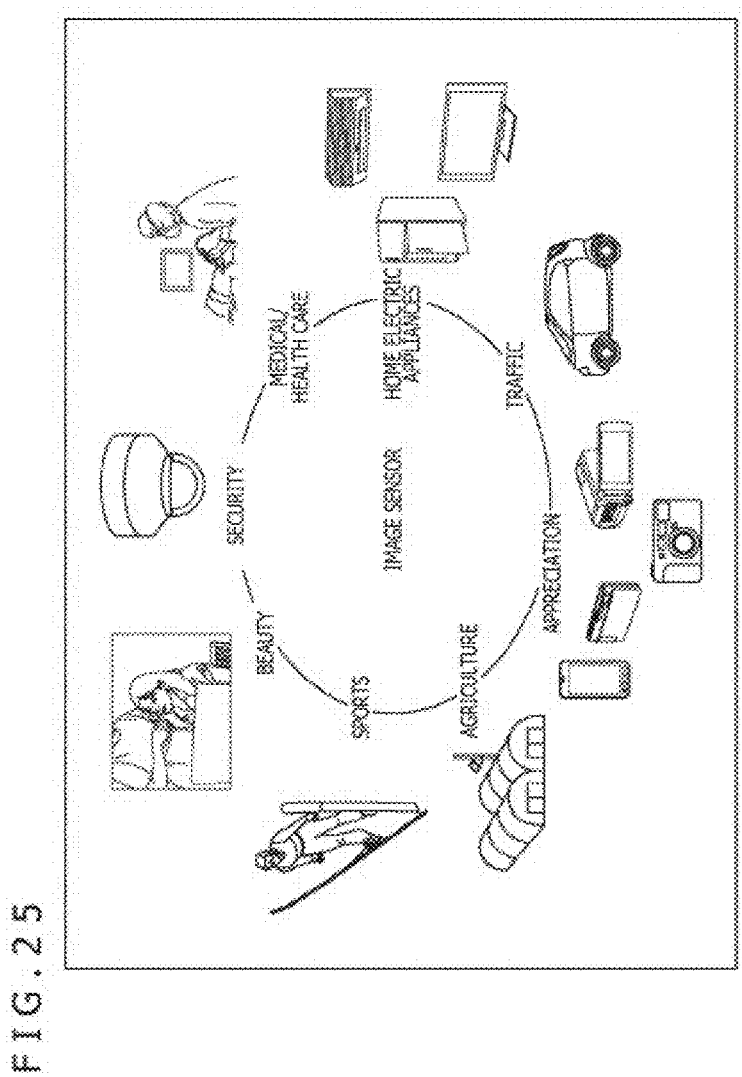
FIG. 25 is a diagram depicting a usage example of the solid-state imaging device to which the present technology is applied.

FIG. 25 is a diagram depicting a usage example of the solid-state imaging device to which the present technology is applied.

The CMOS image sensor 10 (FIG. 1) can be used, for example, in various cases for sensing light such as visible light, infrared light, ultraviolet light and X-ray as described hereinafter. That is, as illustrated in FIG. 25, the CMOS image sensor 10 can be used not only for devices used in the field of appreciation in which images for appreciation are captured, but also for devices used in the field of traffic, the field of home electric appliances, the field of medical and health care, the field of security, the field of beauty, the field of sports, the field of agriculture, or the like.

Specifically, in the field of appreciation, the CMOS image sensor 10 can be used, for example, in a device (electronic apparatus 1000 in FIG. 24, for example) for capturing an image for appreciation, such as a digital camera, a smartphone, and a mobile phone with a camera function.

In the field of traffic, the CMOS image sensor 10 can be used in a device used for traffic such as an in-vehicle sensor for imaging front, rear, circumference, inside, and the like of an automobile, a monitor camera for monitoring traveling vehicles and roads, a ranging sensor for measuring a distance between vehicles or the like, for example, for the purpose of safe driving such as automatic stop, recognition of driver's condition, and the like.

In the field of home electric appliances, the CMOS image sensor 10 can be used in a device for home electric appliances such as a television receiver, a refrigerator and an air conditioner, for example, for the purpose of imaging a user's gesture and operating an apparatus in accordance with the gesture. In the field of medical and health care, the CMOS image sensor 10 can be used, for example, in a device for medical care and health care, such as an endoscope and a device for angiography with a received infrared light.

In the field of security, the CMOS image sensor 10 can be used, for example, in a device for security, such as a crime preventing monitor camera and a person authentication camera. In the field of beauty, the CMOS image sensor 10 can be used, for example, in a device for beauty, such as a skin measuring instrument for imaging skin and a microscope for imaging scalp.

In the field of sports, the CMOS image sensor 10 can be used, for example, in a device for sports, such as an action camera and a wearable camera for sports or the like. In the field of agriculture, the CMOS image sensor 10 can be used, for example, in a device for agriculture such as a camera for monitoring conditions of fields and crops.

10. Application Example to Mobile Bodies

The technology according to the present disclosure (the present technology) can be applied to various products. For example, the technology according to the present disclosure may be implemented as a device mounted on any type of mobile body, such as an automobile, an electric automobile, a hybrid electric automobile, a motorcycle, a bicycle, a personal mobility, an airplane, a drone, a ship, and a robot.

Figure 26:
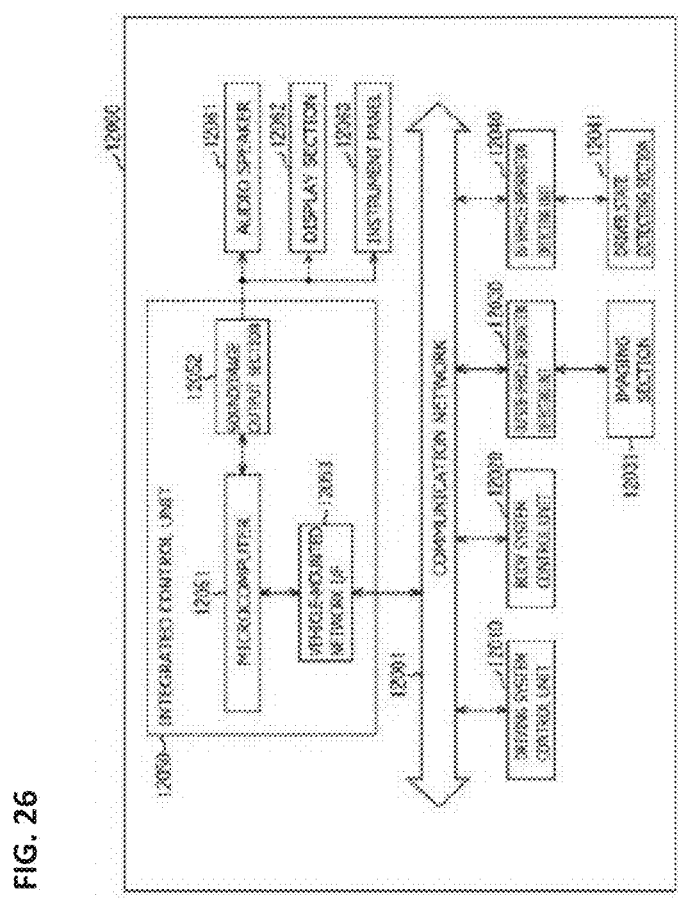
FIG. 26 is a block diagram depicting an example of schematic configuration of a vehicle control system.

FIG. 26 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 26, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 26, an audio speaker 12061, a display section 12062, and an instrument panel 12063 are illustrated as the output device. The display section 12062 may, for example, include at least one of an on-board display and a head-up display.

Figure 27:
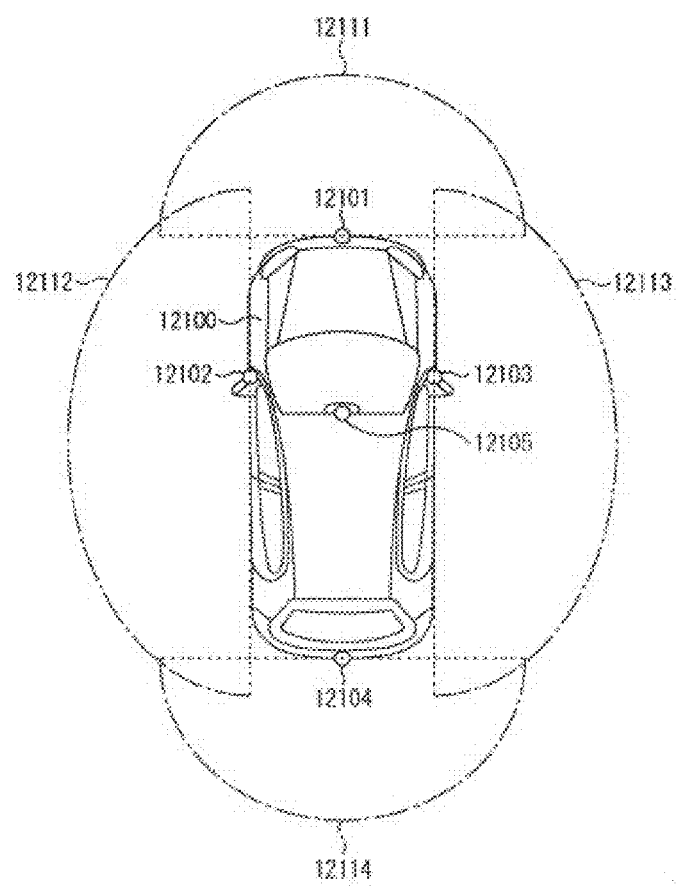
FIG. 27 is a diagram of assistance in explaining an example of installation positions of an outside-vehicle information detecting section and an imaging section.

FIG. 27 is a diagram depicting an example of the installation position of the imaging section 12031.

In FIG. 27, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 27 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described hereinbefore, an example of the vehicle control system to which the technology according to the present disclosure can be applied is explained. The technology according to the present disclosure can be applied to the imaging section 12101 in the configurations explained hereinbefore. Specifically, the CMOS image sensor 10 in FIG. 1 can be applied to the imaging section 12031. The technology according to the present disclosure is applied to the imaging section 12031, so that, for example, the pixel property can be improved and generation of residual images or decrease in the sensor sensitivity can be suppressed to obtain a captured image with higher quality. Hence, obstacles such as pedestrians can be more accurately recognized.

Note that the embodiments of the present technology are not limited to the embodiments described hereinbefore, and can be variously modified without departing from the gist of the present technology.

Furthermore, the present technology can have the following configurations.

(1)
A solid-state imaging device including:
a first electrode formed on a semiconductor layer;
a photoelectric conversion layer formed on the first electrode;
a second electrode formed on the photoelectric conversion layer; and
a third electrode disposed between the first electrode and an adjacent first electrode, and electrically insulated,
in which a voltage of the third electrode is controlled to a voltage corresponding to a detection result which can contribute to control of discharge of charges or assist for transfer of charges.

(2)
The solid-state imaging device according to (1), in which the detection result includes at least one of detection results regarding a light amount or a temperature.

(3)
The solid-state imaging device according to (1) or (2), in which the voltage of the third electrode during exposure is feedback-controlled according to an output of a frame image obtained before exposure.

(4)
The solid-state imaging device according to (3), in which
in a case in which a level corresponding to the output of the frame image is higher than a predetermined threshold value, the voltage of the third electrode is decreased to discharge unnecessary charges, and
in a case in which the level corresponding to the output of the frame image is lower than the predetermined threshold value, the voltage of the third electrode is increased to assist the charge transfer.

(5)
The solid-state imaging device according to (1) or (2), in which the voltage of the third electrode during a signal level output is feedback-controlled according to a reset level output of a pixel including the first electrode and the photoelectric conversion layer.

(6)
The solid-state imaging device according to (5), in which
in a case in which a level corresponding to the reset level output is higher than a predetermined threshold value, the voltage of the third electrode during the signal level output is decreased to discharge unnecessary charges, and
in a case in which the level corresponding to the reset level output is lower than the predetermined threshold value, the voltage of the third electrode during the signal level output is increased to assist the charge transfer.

(7)
The solid-state imaging device according to (1) or (2), further including:
a temperature sensor,
in which the voltage of the third electrode during imaging is feedback-controlled according to a temperature detection result from the temperature sensor.

(8)
The solid-state imaging device according to (7), in which
in a case in which a level corresponding to the temperature detection result is higher than a predetermined threshold value, the voltage of the third electrode is decreased to discharge unnecessary charges, and
in a case in which the level corresponding to the temperature detection temperature is lower than the predetermined threshold value, the voltage of the third electrode is increased to assist the charge transfer.

(9)
The solid-state imaging device according to (1) or (2), in which, according to an output of a light-shielding pixel disposed in a vicinity of a valid pixel including the first electrode and the photoelectric conversion layer, the voltage of the third electrode disposed for the valid pixel during imaging is feedback-controlled.

(10)
The solid-state imaging device according to (9), in which
in a case in which a level corresponding to the output of the light-shielding pixel is higher than a predetermined threshold value, the voltage of the third electrode of the valid pixel is decreased to discharge unnecessary charges, and
in a case in which the level corresponding to the output of the light-shielding pixel is lower than the predetermined threshold value, the voltage of the third electrode of the valid pixel is increased to assist the charge transfer.

(11)
The solid-state imaging device according to (1) or (2), in which the voltage of the third electrode during imaging is feedback-controlled according to a preset gain.

(12)
The solid-state imaging device according to (11), in which
in a case in which a level corresponding to the gain is lower than a predetermined threshold value, the voltage of the third electrode is decreased to discharge unnecessary charges, and
in a case in which the level corresponding to the gain is higher than the predetermined threshold value, the voltage of the third electrode is increased to assist the charge transfer.

(13)
The solid-state imaging device according to any one of (1) to (12), in which the first electrode is divided into an accumulation electrode for accumulating charges, a transfer electrode for transferring charges, and a readout electrode for reading out charges.

(14)
The solid-state imaging device according to any one of (1) to (13), further including:
- a pixel array section in which pixels each including the first electrode and the photoelectric conversion layer are two-dimensionally arranged,
- in which the third electrode is formed so as to surround the first electrode of the pixel in a case in which the third electrode is viewed from a light incidence side.

(15)
The solid-state imaging device according to (14), in which one or a plurality of the third electrodes is disposed for one pixel.

(16)
The solid-state imaging device according to (14), in which the single third electrode is disposed for all pixels or a plurality of pixels.

(17)
The solid-state imaging device according to (14), in which the voltage of the third electrode is controlled by a one-pixel unit, a plural-pixel unit, or an all-pixel unit.

(18)
The solid-state imaging device according to any one of (1) to (17), further including:
- a control circuit for controlling the voltage of the third electrode.

(19)
The solid-state imaging device according to any one of (1) to (17), in which the voltage of the third electrode is controlled by an external control circuit.

(20)
An electronic apparatus mounted with a solid-state imaging device, the solid-state imaging device including
- a first electrode formed on a semiconductor layer,
- a photoelectric conversion layer formed on the first electrode,
- a second electrode formed on the photoelectric conversion layer, and
- a third electrode disposed between the first electrode and an adjacent first electrode, and electrically insulated,
- in which a voltage of the third electrode is controlled to a voltage corresponding to a detection result which can contribute to control of discharge of charges or assist for transfer of charges.

REFERENCE SIGNS LIST

10 CMOS image sensor, 11 Pixel array section, 12 Vertical drive circuit, 13 Column signal processing circuit, 14 Horizontal drive circuit, 15 Output circuit, 16 Control circuit, 17 Input/output terminal, 21 Pixel drive line, 22 Vertical signal line, 23 Horizontal signal line, 30 Sensor section, 31 Valid pixel, 32 Light-shielding pixel, 35 Temperature sensor, 40 CDS circuit, 50 Control circuit, 100 Pixel, 111 Semiconductor layer, 112 Interlayer insulating layer, 113 Lower electrode, 114, 114-1, 114-2 Shield electrode, 115 Photoelectric conversion layer, 116 Upper electrode, 121 Floating diffusion region, 141 Insulating film, 1000 Electronic apparatus, 1001 Solid-state imaging device, 12031 Imaging section

The invention claimed is:

1. A light detecting device, comprising:
a semiconductor layer;
a first electrode and a third electrode on the semiconductor layer;
a photoelectric conversion layer on the first electrode and the third electrode;
a second electrode on the photoelectric conversion layer;
an insulation film between the third electrode and the photoelectric conversion layer; and
a control circuit configured to:
control a voltage of the third electrode based on a temperature of the light detecting device, and
control discharge of charges or transfer of charges from the third electrode based on the voltage of the third electrode.

2. The light detecting device according to claim 1, wherein
the photoelectric conversion layer is configured to receive light, and
the control circuit is further configured to control the voltage of the third electrode based on a light amount of the light received by the photoelectric conversion layer.

3. The light detecting device according to claim 2, wherein the control circuit is further configured to:
obtain an output of a frame image before exposure; and
feedback-control the voltage of the third electrode during the exposure based on the output of the frame image obtained before the exposure.

4. The light detecting device according to claim 3, wherein the control circuit is further configured to:
determine a level corresponding to the frame image before the exposure;
decrease the voltage of the third electrode, in a case where the determined level corresponding to the frame image is higher than a threshold value to discharge unnecessary charges; and
increase the voltage of the third electrode, in a case where the determined level corresponding to the frame image is lower than the threshold value, to assist the transfer of charges.

5. The light detecting device according to claim 2, wherein
at least the first electrode and the photoelectric conversion layer constitute a pixel,
the pixel is configured to output a reset level, and
the control circuit is further configured to feedback-control the voltage of the third electrode, during a signal level output, based on the reset level.

6. The light detecting device according to claim 5, wherein the control circuit is further configured to:
determine a level corresponding to a frame image before exposure;
decrease the voltage of the third electrode during the signal level output, in a case where the determined level corresponding to the reset level is higher than a threshold value, to discharge unnecessary charges; and
increase the voltage of the third electrode during the signal level output, in a case where the determined level corresponding to the reset level is lower than the threshold value, to assist the transfer of charges.

7. The light detecting device according to claim 2, further comprising a temperature sensor configured to detect a temperature detection result, wherein the control circuit is further configured to feedback-control the voltage of the third electrode, during image capture, based on the temperature detection result.

8. The light detecting device according to claim 7, wherein the control circuit is further configured to:
    determine a level corresponding to the temperature detection result;
    decrease the voltage of the third electrode, in a case where the determined level corresponding to the temperature detection result is higher than a threshold value, to discharge unnecessary charges; and
    increase the voltage of the third electrode, in a case where the determined level corresponding to the temperature detection result is lower than the threshold value, to assist the transfer of charges.

9. The light detecting device according to claim 2, wherein
    at least the first electrode and the photoelectric conversion layer constitute a valid pixel,
    a light-shielding pixel, in a vicinity of the valid pixel, is configured to generate an output, and
    the control circuit is further configured to feedback-control the voltage of the third electrode, during image capture, based on the output of the light-shielding pixel.

10. The light detecting device according to claim 9, wherein the control circuit is further configured to:
    determine a level corresponding to the output of the light-shielding pixel;
    decrease the voltage of the third electrode, in a case where the determined level corresponding to the output of the light-shielding pixel is higher than a threshold value, to discharge unnecessary charges; and
    increase the voltage of the third electrode, in a case where the determined level corresponding to the output of the light-shielding pixel is lower than the threshold value, to assist the transfer of charges.

11. The light detecting device according to claim 2, wherein the voltage of the third electrode during image capture is feedback-controlled based on a preset gain.

12. The light detecting device according to claim 11, wherein the control circuit is further configured to:
    determine a level corresponding to the preset gain;
    decrease the voltage of the third electrode, in a case where the determined level corresponding to the preset gain is lower than a threshold value, to discharge unnecessary charges; and
    increase the voltage of the third electrode, in a case where the determined level corresponding to the preset gain is higher than the threshold value, transfer of charges.

13. The light detecting device according to claim 2, wherein the first electrode is divided into an accumulation electrode to accumulate charges, a transfer electrode to transfer charges, and a readout electrode to read out charges.

14. The light detecting device according to claim 2, further comprising a pixel array section including a plurality of pixels, wherein
    the plurality of pixels is two-dimensionally arranged,
    each pixel, of the plurality of pixels, includes the first electrode and the photoelectric conversion layer, and
    the third electrode surrounds the first electrode in a case where the third electrode is viewed from a light incidence side.

15. The light detecting device according to claim 14, further comprising a plurality of third electrodes, wherein
    the plurality of third electrodes includes the third electrode, and
    one or the plurality of third electrodes is for one pixel of the plurality of pixels.

16. The light detecting device according to claim 14, wherein the third electrode is for the plurality of pixels.

17. The light detecting device according to claim 14, wherein the voltage of the third electrode is controlled by a one-pixel unit, a plural-pixel unit, or an all-pixel unit.

18. An electronic apparatus, comprising:
    a light detecting device that includes:
        a semiconductor layer;
        a first electrode and a third electrode on the semiconductor layer;
        a photoelectric conversion layer on the first electrode and the third electrode;
        a second electrode on the photoelectric conversion layer;
        an insulation film between the third electrode and the photoelectric conversion layer; and
        a control circuit configured to:
            control a voltage of the third electrode based on a temperature of the light detecting device, and
            control discharge of charges or transfer of charges from the third electrode based on the voltage of the third electrode.

* * * * *